United States Patent [19]

Anazawa et al.

[11] Patent Number: 4,527,010
[45] Date of Patent: Jul. 2, 1985

[54] ELECTRONIC PART MOUNTING CONSTRUCTION AND METHOD FOR MANUFACTURING THE SAME

[75] Inventors: Shinzo Anazawa; Hitoshi Yamada, both of Tokyo; Kuniharu Noda; Yasuyuki Fujimoto, both of Aichi, all of Japan

[73] Assignees: Nippon Electric Co., Ltd.; Narumi China Corporation, both of Japan

[21] Appl. No.: 403,443

[22] Filed: Jul. 30, 1982

[30] Foreign Application Priority Data

Jul. 31, 1981 [JP] Japan .................................. 56-120245

[51] Int. Cl.³ ............................................... H05K 5/06
[52] U.S. Cl. .................................... 174/52 FP; 357/74
[58] Field of Search ........................ 174/52 FP, 52 S; 357/74

[56] References Cited

U.S. PATENT DOCUMENTS 3,349,481 10/1967 Karp .......................... 174/52 FP X
3,681,513 8/1972 Hargis ............................. 357/74 X
4,147,889 4/1979 Andrews et al. ............... 174/52 FP Primary Examiner—A. T. Grimley
Assistant Examiner—D. A. Tone
Attorney, Agent, or Firm—Sughrue, Mion, Zinn, Macpeak and Seas

[57] ABSTRACT

An electronic part mounting construction, such as a transistor package or a substrate for a resin mold device, has a substrate for mounting an electronic part on a principal surface, at least one metallized layer deposited on the principal surface and soldered to the electronic part thereon, another metallized layer continuously extended from the at least one metallized layer in a direction perpendicular thereto, and an insulator layer deposited on the other metallized layer. The other metallized layer is provided on a side surface of a wall member or the substrate. The other metallized layer and the insulator layer may be formed by steps of forming a hole in an insulator sheet, depositing a metallized layer and an insulator layer successively on the surface of the hole, and leaving the metallized layer and the insulator layer at predetermined region(s) by punching the insulator sheet.

12 Claims, 14 Drawing Figures

ELECTRONIC PART MOUNTING CONSTRUCTION AND METHOD FOR MANUFACTURING THE SAME

BACKGROUND OF THE INVENTION

The present invention relates to a construction to be used for mounting electronic parts, such as semiconductor devices or the like, and to a method for manufacturing the same. The term "construction" as used herein means not only a container or a package having a stem and a wall member for airtightly sealing electronic parts therein, but also a stem for supporting electronic parts of the type not specifically necessitating a wall member.

Generally, as one such type of electronic part mounting construction, a package or a container for a super high frequency semiconductor device has been known. In such a package, it is common practice that metallized layers electrically connected to respective electrodes of a semiconductor element are deposited on the package and external connection leads are attached to the respective metallized layers by means of soldering material. In such a package, it is necessary to minimize the parasitic inductance and parasitic capacitance caused by the metallized layers, the external connection leads and the like.

Heretofore, in order to reduce the parasitic inductance and the parasitic capacitance, a package for a semiconductor device has been proposed in which a lid member attached on the top of a wall member for airtightly sealing a semiconductor device therein is formed of a metal. This lid member and the semiconductor device on a stem of the package are electrically connected through a metallized layer formed on the inside surface of a wall member (See the specification of Japanese Patent Application No. 55-78001, the disclosure of which is incorporated herein by reference). In addition, the above-referenced specification also discloses a method for forming a metallized layer of a precise width on an inside surface of a wall member. According to the proposed method, the precisely controlled metallized layer is formed by the steps of forming a groove on the inside surface of the wall member and forming a metallized layer only in this groove.

According to the above-described proposal, it is clearly possible to reduce the parasitic capacitance and inductance. However, in the case where the metallized layer on a stem mounting a semiconductor device continuously extends to the metallized layer deposited on the inside surface of the wall member, a soldering material (for example, Au-Si) for mounting the semiconductor device is apt to flow along the metallized layer on the stem and also to climb up to the top portion of the wall member along the metallized layer on the inside surface. Since the types of solder used in mounting the semiconductor and in sealing the lid member are usually different, the lid member sealing solder may be contaminated by the solder which climbs up the metallized layer, thus resulting in a sealing failure between the lid member and the wall member. Furthermore, when the lid member is soldered to the top portion of the wall member by a soldering material such as Au-Sn, this soldering material is apt to flow out onto the metallized layer on the substrate along the metallized layer on the inside surface of the wall member, resulting in a cut-off of the metallic wirings bonded between the semiconductor element and the metallized layer on the stem.

The above-mentioned phenomenon that the soldering material climbs up along the metallized layer or flows down along the metallized layer has also been observed in the case where a metallized layer is formed on the outer peripheral surface of the stem and soldered to an external connection lead.

SUMMARY OF THE INVENTION

It is a primary object of the present invention to provide an electronic part mounting construction in which a soldering material is prevented from flowing along a metallized layer deposited on a side surface.

It is another object of the present invention to provide a method for manufacturing an electronic part mounting construction provided with a wall member in which the phenomenon of a soldering material climbing up or flowing down can be prevented.

An electronic part mounting construction according to the present invention has a main surface on which a semiconductor element is mounted, and at least one other surface extending in a direction perpendicular to the main surface, the other surface having a metallized layer covered by an insulator layer.

According to another aspect of the present invention, a method for manufacturing an electronic part mounting construction which has a main surface for mounting a semiconductor element and another surface extending perpendicular to the main surface and having a metallized layer covered by an insulator layer, includes the steps of preparing a board of insulator used for making a wall member, forming a first hole in the board, forming a metallized layer the surface of the first hole, covering the metallized layer by an insulator layer, and leaving the metallized layer and the insulator layer on one side of the first hole by forming a second hole which covers all the sides of the first hole except for the one side.

According to the present invention, because there is an insulator layer covering the metallized layer on the other surface, the solder for mounting the semiconductor element, a lid member or an external lead is blocked from flowing along the surface of the metallic layer to other portions. Therefore, the airtight seal of package is not damaged by solder climbing up the metallic layer. The wirings bonded to the main surface are also protected from melting out by solder climbing down from the lid member or coming from an external lead.

According to another aspect of the present invention, because the insulator-covered metallized layer on the one side of the first hole is left by forming the second hole, the final shape of the insulator-covered metallized layer can be defined precisely. Further, the parasitic capacitance or inductance due to a deviation of size can be minimized.

DETAILED DESCRIPTION OF THE INVENTION

Figure 1:
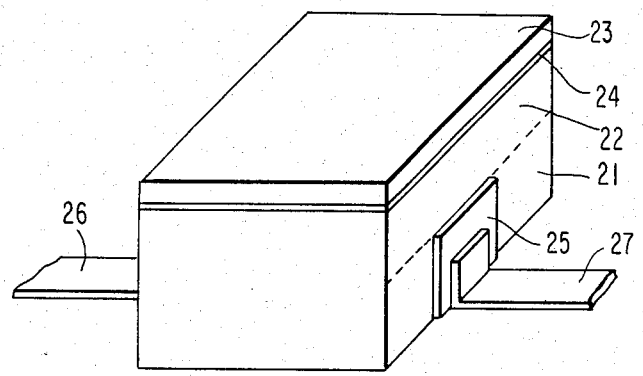
FIG. 1 is a perspective view of an electronic part mounting construction according to a first preferred embodiment of the present invention.
Figure 2:
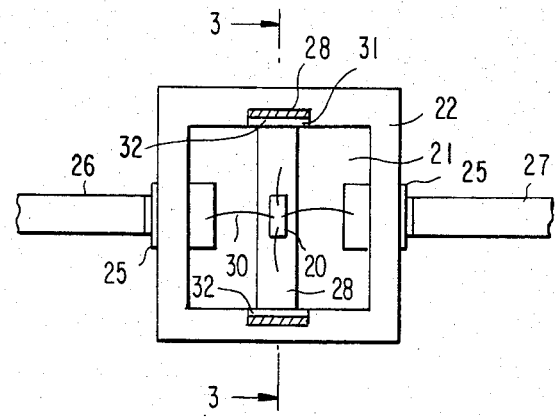
FIG. 2 is a plan view of the construction shown in FIG. 1 with the lid removed.
Figure 3:
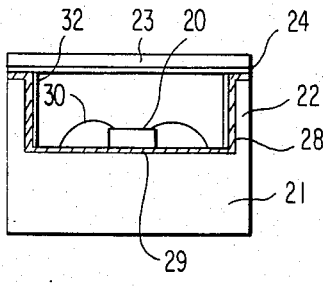
FIG. 3 is a cross-sectional view taken from FIG. 2 with the lid member attached.

Referring now to FIGS. 1 to 3, the electronic part mounting construction according to a first preferred embodiment of the present invention forms a package for encasing a field effect transistor (FET) chip 20 (See FIGS. 2 and 3) for use in a super high frequency band. As shown in FIG. 1, this package comprises a ceramic substrate 21, a ceramic wall member 22 mounted on the substrate 21 with a retaining space on the inside thereof, and a lid member 23 mounted on the top of the wall member 22. The lid member 23 is formed of metal such as Cu, Kovar, etc., similar to that in Japanese Pat. No. 55-78001, and is soldered on the wall member 22 by a soldering material such as Au-Sn or the like. This lid member 23 is to be connected to the source of the FET chip 20 to serve as a source electrode.

Metallized layers 25 extending up to the inner space surrounded by the wall member 22 are deposited on the outer peripheral surface of the substrate 21. The external connection leads 26 and 27 are soldered to those metallized layers 25 by a soldering material (not shown). The left side lead 26 in FIG. 1 serves as a gate electrode, while the right side lead 27 is used as a drain electrode.

Further, referring to FIGS. 2 and 3, a metallized layer 28 is provided on one principal surface of the substrate 21 to be used as a source that is deposited on the principal surface so as to traverse its central portion. This source metallized layer 28 extends along inside surfaces of the wall member 22 up to the top end of the wall member 22. Accordingly, as shown in FIG. 3, in the case where the metallic lid member 23 is mounted on the top of the wall member 22 by a soldering material 24, the source metallized layer 28 is electrically connected to the lid member 23. A gate metallized layer to be connected to the gate lead 26 and a drain metallized layer to be connected to the drain lead 27 are deposited on the principal surface of the substrate 21 as shown in FIG. 2.

The FET chip 20 is mounted on the source metallized layer 28 by a soldering material 29 such as Au-Si or the like, and connections between the respective metallized layers and the electrodes on the chip 20 are made by bonding with metallic wires 30. On the inside surfaces of the wall member 22, grooves 31 are provided in the portions where the source metallized layer 28 is deposited, and the metallized layer 28 on the inside surfaces is deposited only in these grooves 31. With such a structure, since the size of the metallized layer 28 on the inside surfaces of the wall member 22 is precisely defined by the width and height of the grooves 31, it is possible to make the inductance and other characteristics of the metallized layer 28 exactly equal to designed values.

An insulator layer 32 is provided to cover the metallized layer 28 in the grooves 31 as mentioned above. Otherwise, when the FET chip 20 is mounted on the source metallized layer 28 by a soldering material 29, it has been observed that not only does the soldering material 29 flow out along the metallized layer 28 and reach the wall member 22, but it also climbs along the metallized layer 28 on the inside surface of the wall member 22 and eventually reaches even the top of the wall member 22. Since the soldering material 29 for mounting the FET chip 20 (e.g. Au-Si) is different rom the soldering material 24 for sealing the lid member 23 (e.g. Au-Sn), if the soldering material 29 for mounting the FET chip 20 flows up to the top of the wall member 22 it would adversely affect the sealing reliability of the lid member 23, resulting in a lack of air-tightness. Similarly, upon mounting the lid member 23, the soldering material 24 for mounting the lid member 23 also flows out along the metallized layer 28 on the inside surface of the wall member 22, and thereby also the air-tightness is often deteriorated. Furthermore, in the event that the soldering material 24 has flowed along the metallized layer 28 on the substrate 21, the bonded fine metallic wire 30 may accidentally peel off or fuse, resulting in an open-circuit in the source electrode wiring.

According to the preferred embodiment illustrated in FIGS. 2 and 3, the source metallized layer 28 in the grooves 31 on the inside surfaces of the wall member 22 is entirely coated with an insulator layer 32 made of the same material as the ceramic of the substrate 21. In this way, by coating the metallized layer 28 on the inside surfaces of the wall member 22 with the insulator layer 32 prior to the steps of mounting the chip 20 and sealing the lid member 23 by a soldering material, the soldering material can be prevented from flowing out during the subsequent soldering steps. Accordingly, the reliability of the sealing of the lid member 23 is improved, and also the faults caused by peel-off or cut-off of the fine metallic wires 30 can be prevented.

With regard to a method for leaving the metallized layer 28 and the insulator layer 32 only in the grooves 31 on the wall member 22, since a detailed description is given in the previously referenced specification of Japanese Pat. No. 55-78001, only a general description will be given here. At first, a first aperture having two opposed sides which correspond to the pair of grooves 31 shown in FIG. 2 is punched in an unsintered ceramic sheet (hereinafter called a "green sheet"). Then, after a metallized layer has been deposited on the inside surface of the first aperture, an insulator layer principally made of alumina is formed thereon through a screen printing process or the like. Subsequently, a second aperture intersecting with the first aperture is opened while leaving the two opposed sides undisturbed, to leave the metallized layer 28 and the insulation layer 32 only on these two opposed sides and remove the metallized layer and insulator layer at the other portions. By this process, these two opposed sides left in the form of the grooves 31 in the wall member 22 as shown in FIG. 2 can be manufactured. Thereafter, the wall member 22 is sintered jointly with the substrate 21 formed with a metallized layer, as described in the aforementioned specification, to integrate the wall member 22 and the substrate 21, and the FET chip 20 and the lid member 23 are mounted by soldering.

Figure 4:
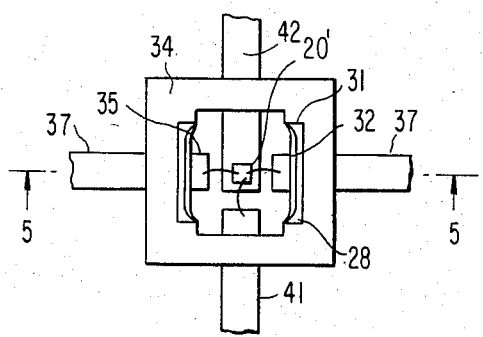
FIG. 4 is a plan view showing an electronic part mounting construction according to a second preferred embodiment of the present invention with a lid memmber removed.
Figure 5:
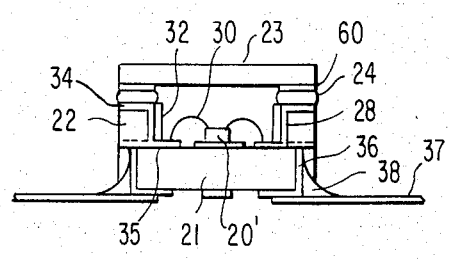
FIG. 5 is a cross-sectional view taken from FIG. 4 with the lid member attached.

Referring now to FIGS. 4 and 5, an electronic part mounting construction according to a second preferred embodiment of the present invention has a structure adapted for encasing a bipolar type transistor chip 20'. This embodiment comprises a substrate 21 of rectangular shape, a wall member 22 mounted on this substrate 21 with a retaining space inside thereof, and a lid member 23 made of an insulator having a metallized layer 60 formed thereon (or else a metallic lid member) which is adhered to the top of the wall member 22 by a soldering material (for instance, Au-Sn) 24. Metallized layers 28 are deposited in grooves 31 formed on the inside surfaces of the wall member 22, and are coated with insulator layers 32 of alumina or the like. The metallized layers 28 on the inside surfaces extend also onto the top surface of the wall member 22 to form metallized extension 34.

Furthermore, this embodiment provides a pair of emitter metallized layers 35 on the principal surface of the substrate 21 and electrically connected to the metallized layers 28 on the inside surface. These metallized layers 35 are electrically connected to emitter leads 37 via outer peripheral surface metallized layers 36 deposited along the outer peripheral surface of the substrate 21 (see FIG. 5). The emitter leads 37 are adhered to the outer peripheral surface metallized layers 36 by a soldering material 38 such as Ag-Cu or the like. It is to be noted that, in the case of the illustrated embodiment, since the outer peripheral surface metallized layer 36 is formed in a recess provided along the outer periphery of the substrate 21, and since the soldering material 38 has a meniscus shape, the bonding strength of the leads 37 is extremely high.

Besides the above-mentioned emitter metallized layers 35, a base metallized layer and a collector metallized layer on which a transistor chip 20' is mounted are also formed on the principal surface of the substrate 21, and these base and collector metallized layers are connected respectively to a base lead 41 and a collector lead 42 in a manner similar to the emitter metallized layers 35.

In this preferred embodiment, the metallized layers 28 are formed on the inside surfaces of the wall member 22, and extend to a metallized layer 34 on the top surface of the wall member 22. Generally, it is a common practice to apply Ni or Au plating on the metallized layer 34 on the top surface of the wall member 22 and on the leads, 37, 41 and 42 after soldering of the leads 37, 41 and 42. By employing the above-mentioned construction, the metallized layer 34 on the top surface of the wall member 22 and the emitter leads 37 can be maintained at the same potential during plating because these are connected by the metallized layers 28, 35 and 36. This implies that connection wires for maintaining the respective leads 37, 41 and 42 and the metallized layers 34 at the same potential can be omitted. Furthermore, the electrical connection between the metallized layer 34 and the emitter leads 37, which usually function as common electrode leads, presents the effect of an electrostatic shield of the transistor chip 20' effected by a metal lid member.

Figure 6:
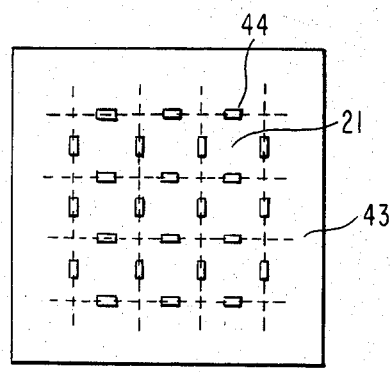
FIG. 6 is a view to be used for explaining a method for manufacturing a substrate according to the second preferred embodiment.
Figure 7:
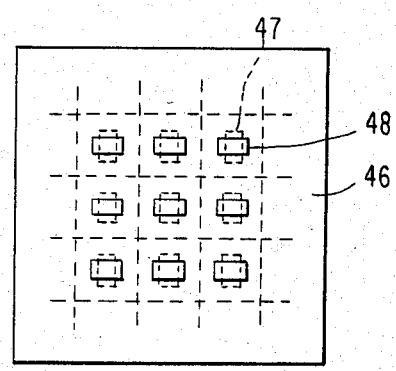
FIG. 7 is a view to be used for explaining the method for manufacturing a wall member according to the second preferred embodiment.

Now a method for manufacturing the package according to the second preferred embodiment will be explained by jointly referring to FIGS. 6 and 7. As shown in FIG. 6, through-holes 44 are punched out in a green sheet 43 to be processed as a substrate 21. These through-holes 44 are opened on boundary lines between the regions to be processed as individual substrates 21 as shown by dash lines. Under such a condition, necessary metallized layers are formed on the inside surfaces of the through-holes 44 and on the upper and lower surfaces of the green sheet 43.

Next, on another green sheet 46 for forming the wall member 22, first apertures 47 as indicated by dash lines are formed within the regions to be processed as the individual wall members 22 also represented by dash lines. After metallized layers are formed inside of these first apertures 47, insulating layers are subsequently deposited thereon. Under such a condition, second apertures 48 which intersect with the first apertures 47 are formed as shown by solid lines so as to leave parts of the first apertures 47 which do not overlap with the second aperture 48. As a result, the metallized layers and insulator layers on the portions of the first apertures 47 overlapping with the second apertures 48 are removed, and as shown in FIG. 4, the metallized layers 28 and the insulator layers 32 in the grooves 31 are formed.

Subsequently, the green sheets 43 and 46 which have been subjected to the above-described treatment are put together. After these sheets 43 and 46 have been jointly sintered within a reducing atmosphere containing wet hydrogen at about 1600° C., they are cut along the dash lines (boundary lines) in FIGS. 6 and 7 to be separated into individual unit products. Next, the exposed surfaces of the metallized layers 34, 35 and 36 are subjected to Ni plating or the like. Thereafter, an emitter lead 37, a base lead 41 and a collector lead 42 are attached thereto by a soldering material 38. Ni or Au plating is then effected, and thereby a package for mounting a semiconductor element has been constructed. Thereafter, a transistor chip 20' is mounted on the collector metallized layer by a soldering material such as Au-Si or the like. The electrodes on the transistor chip 20' are electrically connected to the metallized layers on the substrate 21 by fine metallic wires. Finally, the lid member 23 is adhered to the top of the wall member 22 by a soldering material 24 for air-tightly sealing the transistore 20'.

In such a structure, owing to the fact that the metallized layers 28 on the inside surfaces of the wall member 22 are coated with the insulator layers 32, upon soldering the lid member 23 the soldering material 24 can be prevented from flowing out along the metallized layers 28 on the inside surfaces. Accordingly, the airtightness of the package can be enhanced and also the transistor chip 20' and the bonding wires 30 are prevented from being damaged by the soldering material 24. In the illustrated embodiment, the outflow of the soldering material for mounting the chip 20' is limited to the collector metallized layer and it will not reach the top surface of the wall member 22.

Figure 8:
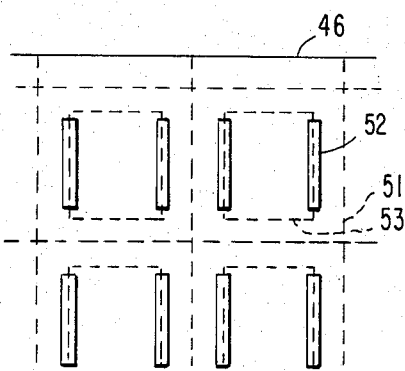
FIG. 8 is a view showing another method for manufacturing the wall member.

Another embodiment of the method for manufacturing a wall member 22, having grooves 31 on its inside surfaces as shown in FIGS. 4 and 5, will be described with reference to FIG. 8. Similarly to the case illustrated in FIG. 7, a green sheet 46 is prepared and a pair of through-holes 52 are opened in each of the regions to be formed into individual wall members (the regions within the boundary lines 51). Next, metallized layers and insulator layers are successively deposited on the inside surfaces of the through-holes 52. Subsequently, apertures 52 are opened along cut lines 53 indicated by dash lines. Thus, the inside half of each through-hole 52 is cut away and only the outside half thereof is retained, and metallized layers and insulator layers remain deposited on the side surfaces of the outside halves of the through-holes 52. Accordingly, through the above-mentioned method also, the wall member 22 illustrated in FIGS. 4 and 5 can be manufactured.

Figure 9:
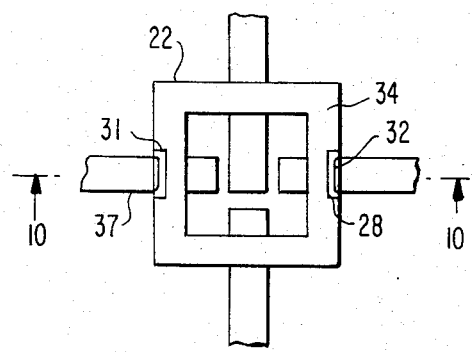
FIG. 9 is a plan view showing an electronic parts mounting construction according to a third preferred embodiment of the present invention.
Figure 10:
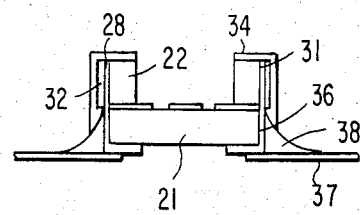
FIG. 10 is a cross-sectional view of the construction of FIG. 9.

With reference to FIGS. 9 and 10, an electronic part mounting construction for encasing a bipolar transistor according to a third preferred embodiment of the present invention comprises, as in the second preferred embodiment, metallized layers on a principal surface of a substrate 21. In this preferred embodiment, grooves 31 are formed on the outside surfaces of the wall member 22, and these grooves 31 are continuous with a recess formed along the outer peripheral surface of the substrate 21. Metallized layers 28 and insulator layers 32 are deposited on the outside surfaces of wall members 22 at the regions forming the inside surfaces of the grooves in the wall member 22. The metallized layers 28 are electrically connected to emitter metallized layers on the substrate 21 and to outer peripheral surface metallized layers 36 formed in the recess on the outer peripheral surface of the substrate 21. The substrate 21 shown in FIG. 10 can be manufactured from a green sheet 43 similar to that shown in FIG. 6.

In the embodiment shown in FIG. 10, in the case where the leads 37 are mounted by a soldering material 38 such as Ag-Cu or the like, unless the insulator layers 32 are present, the soldering material 38 would climb along the metallized layers 28 up to the top end of the wall member 22, and thus the sealing property for the lid member (not shown) would be degraded. However, since the insulator layers 32 are deposited on the metallized layers 28, the above-mentioned climbing phenomenon of the soldering material would never arise. In this connection, the metallized layer 34 on the top of the wall member 22 is electrically connected to the leads 37 to simplify the plating process to be subsequently affected and to obtain the electro-static shield effect of the metal lid member 23 (if the lid member is made of metal), similarly to the case of the second preferred embodiment.

Figure 11:
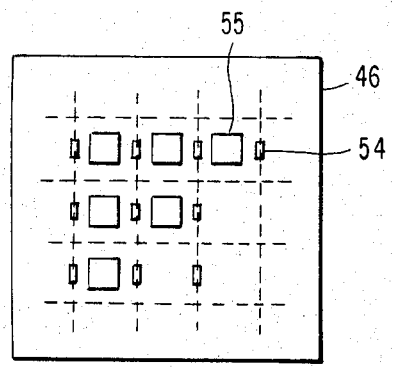
FIG. 11 is a view to be used for explaining the method for manufacturing a wall member according to the third preferred embodiment.

The method for manufacturing the wall member 22 illustrated in FIGS. 9 and 10 will be described with reference to FIG. 11. At first, a green sheet 46 is prepared and through-holes 54 are opened only along the boundary lines in the longitudinal direction. Next, metallized layers and insulator layers are deposited on the inside surfaces of the through-holes 54. Subsequently, apertures 55 are opened at the center portions of the respective regions, and the green sheet 46 is sintered as superposed with a green sheet for substrates (as shown in FIG. 6). The subsequent steps are similar to those for the second preferred embodiment, and therefore, further description thereof will be omitted.

Figure 12:
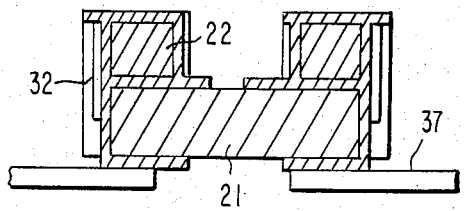
FIG. 12 is a cross-sectional view showing one modification of the method illustrated in FIG. 11.

With reference to FIG. 12, an electronic part mounting construction according to one modification of the third preferred embodiment of the present invention provides insulator layers 32 extending from the outside surfaces of the wall member 22 to the outer peripheral surface of the substrate 21.

Figure 13:
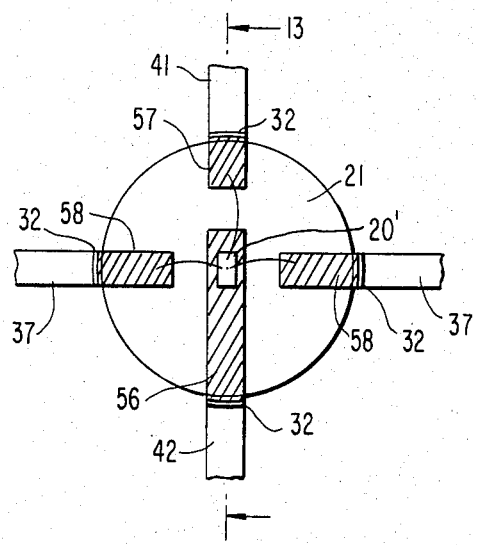
FIG. 13 is a plan view showing an electronic parts mounting construction according to a fourth preferred embodiment of the present invention.
Figure 14:
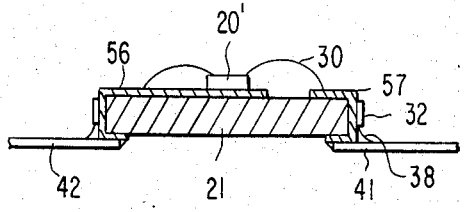
FIG. 14 is a cross-sectional view of the construction of FIG. 13.

Referring now to FIGS. 13 and 14, an electronic part mounting construction according to a fourth preferred embodiment of the present invention comprises a structure adapted for resin seal. The supporting substrate 21 is made of ceramics sintered in a circular shape. Metallized layers are deposited on this substrate 21 through a screen printing process. More particularly, a collector metallized layer 56 on which a semiconductor chip (in the illustrated example, a bipolar transistor) 20' is to be mounted, a base metallized layer 57 and emitter metallized layers 58 are formed on the substrate 21. The respective metallized layers 56, 57 and 58 extend over the outer peripheral surface of the substrate 21 and reach the back surface of the substrate 21.

The portions of the respective metallized layers 56~58 located on the outer peripheral surface of the substrate 21 are partly covered with insulator layer 32 made of the same material as the substrate 21. The insulator layers 32 can be formed through a screen printing process or the like. Insulator layers 32 are located on the outer peripheral surface close to the principal surface of the substrate 21, on which the semiconductor chip 20' is mounted, so as to traverse each metallized layer 56~58 on the outer peripheral surface of the substrate 21. After the respective metallized layers 56~58 and the insulator layers 32 have been deposited, sintering is carried out within a reducing atmosphere at 1400° C., and subsequently emitter leads 37, a base lead 41 and a collector lead 42 are attached to the regions of the respective metallized layers 56~58 on the back surface of the substrate 21 by a soldering material 38. In this construction, since the soldering material 38 climbs up to form a meniscus but is prevented from climbing up from the meniscus portion by the insulator layers 32, the metallized layers 56, 57 and 58 on the principal surface of the substrate 21 would not be contaminated by the soldering material 38. Accordingly, when, after all the leads 37, 41 and 42 have been soldered to the respective metallized layers 56, 57 and 58, the semiconductor chip 20' has been mounted on the collector metallized layer 56 and the electrodes on the chip 20' have been connected to the respective metallized layers 56, 57 and 58 through fine metallic wires 30, neither unreliable soldering of the chip 20' nor poor connection of the fine metallic wires 30 occurs.

Further, according to this fourth preferred embodiment, since the insulator layers 32 are deposited on the outer peripheral surface, i.e. side surface of the substrate 21, the thickness of the insulator layers 32 is practically negligible. In other words, the area of the main surface of the substrate 21 does not need to be enlarged to prevent the soldering material 38 from spreading. This means that the chip mounting construction can be kept small.

While metallized layers 56, 57 and 58 are directly deposited on the outer peripheral surface of the substrate 21 without machining the outer peripheral surface at all in the fourth preferred embodiment, the substrate having recesses on the outer peripheral surface and having metallized layers and insulator layers deposited successively in the recesses could be employed as the substrate 21 similarly to the second or third preferred embodiment. Furthermore, while a sintered ceramic substrate was used in the fourth preferred embodiment, a green sheet could be employed therefore. Also, the shape of the substrate 21 need not be circular, but it is apparent that a rectangular or other shaped substrate may be employed instead. The electronic part mounting construction shown in FIG. 14 could be either put to use in the state shown in FIG. 14 or subjected to resin sealing.

While preferred embodiments of the present invention have been described above, it is obvious that various modifications could be made thereto. For instance, in the first to third preferred embodiments, the metallized layers and the insulator layers could be deposited on both the inside and outside surfaces of the wall member, and the insulator layers could cover only a part of each metallized layer on the inside and outside surfaces.

We claim:

1. An electronic device, comprising: a substrate having a main surface, a first metallic layer formed on said main surface, an electronic element mounted on said first metallic layer, a wall member mounted on said substrate and having at least one inside surface cooperating with said main surface to define a space in which said electronic element is mounted, a second metallic layer formed on said inside surface and contacting said first metallic layer, an insulator layer covering at least a portion of said second metallic layer, a third metallic layer formed on a top surface of said wall member remote from said main surface, and a lid member bonded to said third metallic layer.

2. An electronic device as claimed in claim 1, wherein said inside surface of said wall member is provided with a groove therein and said second metallic layer is formed in said groove.

3. An electronic device as claimed in claim 1, wherein said substrate further includes a side surface outside of said space, said electronic device further comprising a fourth metallic layer formed on said side surface of said substrate and electrically connected to said first metallic layer, and an external lead electrically connected to said fourth metallic layer.

4. An electronic device package comprising a substrate having a main surface and a side surface, a first metallic layer formed on said main surface, a wall member mounted on said substrate and having an inside surface cooperating with said main surface to define a space in which said electronic device is to be mounted, said wall member further having an outside surface outside of said space and a top surface between said inside and outside surfaces and remote from said main surface, a second metallic layer continuously formed on said side surface of said substrate and said outside surface of said wall member, a third metallic layer formed on said top surface of said wall member, and an insulator layer covering at least a portion of said second metallic layer.

5. An electronic device package as claimed in claim 4, wherein the portion of said second metallic layer covered by said second insulator layer is formed on said wall member.

6. An electronic device package as claimed in claim 5, wherein said insulator layer further covers at least a portion of the second metallic layer formed on said substrate.

7. An electronic device comprising a substrate having a main surface and a side surface, a first metallic layer formed on said main surface, an electronic element soldered on said first metallic layer, a second metallic layer formed on said side surface, an insulator layer covering at least a portion of said second metallic layer, and an external lead soldered to said second metallic layer.

8. An electric part mounting construction comprising a substrate having one principal surface on which an electric part is to be mounted, a wall member mounted on said substrate, said wall member having at least one inside surface intersecting said one principal surface to define a space in which said electric part is to be mounted, said inside surface having a groove formed therein, a metallic layer formed in said groove, and an insulator layer formed on at least a portion of said metallic layer.

9. An electric part mounting construction comprising a substrate having one principal surface on which an electric part is to be mounted, a wall member mounted on said substrate and having at least one inside surface intersecting said one principal surface, said one principal surface and said one inside surface forming a space in which said electric part is to be mounted, a lid member disposed on an upper portion of said wall member to enclose said space, a metallic layer formed on and extending along said one inside surface from said one principal surface to said upper portion of said wall member, and an insulator layer formed on a portion of said metallic layer between said principal surface and said upper portion of said wall member.

10. An electric part mounting construction comprising a substrate having one principal surface on which an electric part is to be mounted, a wall member having at least one inside surface cooperating with said one principal surface to define a space in which said electric part is to be mounted and at least one outside surface intersecting said one principal surface, a metallic layer formed on said outside surface of said wall member, and an insulator layer formed on at least a portion of said metallic layer.

11. An electronic part mounting construction comprising a substrate having one principal surface on which an electric part is to be mounted and an outer peripheral surface, said outer peripheral surface being provided with at least one recess in a direction intersecting said principal surface, a metallic layer deposited in said recess, and an insulator layer deposited on a portion of said metallic layer in said recess.

12. An electronic part mounting construction comprising a substrate having one principal surface on which an electric part is to be mounted and an outer peripheral surface, a wall member mounted on said substrate and having at least one inside surface cooperating with said one principal surface to define a space in which said electric part is to be mounted and an outer surface, each of said outer peripheral surface of said substrate and said outer surface of said wall member intersecting said one principal surface and being provided with a groove, a metallic layer formed in said grooves of said outer peripheral surface and said outer surface, and an insulator layer formed on at least a portion of said metallic layer in said grooves.

* * * * *